(12) United States Patent
Kapur et al.

(10) Patent No.: US 6,314,545 B1
(45) Date of Patent: Nov. 6, 2001

(54) QUADRATURE SOLUTIONS FOR 3D CAPACITANCE EXTRACTION

(75) Inventors: Sharad Kapur, Hudson County; David Esley Long, Morris County, both of NJ (US)

(73) Assignee: Agere Systems Guardian Corporation, Miami Lakes, FL (US)

( * ) Notice: Subject to any disclaimer, the term of this patent is extended or adjusted under 35 U.S.C. 154(b) by 0 days.

(21) Appl. No.: 09/187,505

(22) Filed: Nov. 6, 1998

Related U.S. Application Data

(63) Continuation-in-part of application No. 08/904,488, filed on Aug. 1, 1997, now Pat. No. 6,064,808.

(51) Int. Cl.[7] .......................... G06F 17/50; G06F 101/00
(52) U.S. Cl. .................................... 716/5; 716/1; 716/15; 703/1; 703/2; 703/14; 345/144; 345/146
(58) Field of Search ................................... 703/5; 716/22

(56) References Cited

U.S. PATENT DOCUMENTS

| | | | |
|---|---|---|---|
| 6,051,027 | * | 4/2000 | Kapur et al. ............................. 703/5 |
| 6,064,808 | * | 5/2000 | Kapur et al. ........................... 716/22 |

OTHER PUBLICATIONS

Zhao, J., "Singularity–treated quadrature–evaluated method of moments solver for 3–D capacitance extraction"; IEEE Conference on Design Automation; Jun. 2000; pp. 536–539.*

(List continued on next page.)

Primary Examiner—Matthew Smith
Assistant Examiner—Jibreel Speight
(74) Attorney, Agent, or Firm—Istrate Ionescu

(57) ABSTRACT

The element to be simulated is divided into regions, and each region is further divided into a plurality of quadrature nodes. Pairs are formed for all the quadrature nodes. Green's functions are computed and stored for the pairs. Each of the pairs is allocated to either the far field or the near field for purposes of simulation in accordance with a criterion. A Gaussian quadrature is computed for the pairs allocated to the far field while a high order quadrature is computed for those allocated in the near field. The component simulation is arrived after combining information derived from the Gaussian quadrature and the high order quadrature into a matrix which is then solved to obtain the charge distribution. Summation of the charges thus obtained yields the capacitance of the element.

The high order quadrature is computed using a plurality of basis functions. The basis functions, denoted $\psi_i^k(r')$, are $1, x, y, x^2, xy, y^2$. The basis functions are used to compute a set of weights $v_j^k$. The weights are computed by solving $$\sum_{j=1}^{p} a_{ij} v_j^k = \int_{T_k} G(r, r') \psi_i^k(r') dr',$$

where $\psi_i^k(r')$ are the basis functions, $G(r,r')$ are the Green's functions for each of the pairs allocated to the near field separated by a distance $r-r'$, and $a_{ij}$ is a matrix satisfying the relationship $a_{ij} = G(r_i, r_j^k) \psi_i(r_j^k)$ and where index k counts the regions in the near field $T_k$, index i counts the number of pairs, and index j counts up to a number p of the quadrature nodes in the near field.

The advantage of this approach is that a fast solution to an integral equation descriptive of the element to be simulated can be achieved in exchange for constructing quadratures.

4 Claims, 3 Drawing Sheets

OTHER PUBLICATIONS

Pham, H.H; Nathan, A., "Generating Gauss quadratures for Green's function randomized algorithm", IEEE Canadian Conference on Electrical and Computer Engineering, 1998, vol. 2, 1998.*

Schlemmer, E. et al, "Accuracy improvements using a modified Gauss–quadrature for integrations methods in electromagnetics", IEEE Transactions on Magnetics, vol.: 28, iss. 2, Mar. 1992.*

* cited by examiner

QUADRATURE SOLUTIONS FOR 3D CAPACITANCE EXTRACTION

CROSSREFERENCES

This application is a continuation in part of U.S. patent application Ser. No. 08/904,488, filed Aug. 1, 1997, now U.S. Pat. No. 6,064,808, titled Method and Apparatus for Designing Interconnections and Passive Components in Integrated Circuits and Equivalent Structures by Efficient Parameter Extraction.

FIELD OF INVENTION

This invention is in the field of simulation, or parameter extraction of characteristics of electrical elements used in the design of printed circuit boards, and solid state integrated circuits.

BACKGROUND OF THE INVENTION

Parameter extraction, or simulation, of electronic elements has a significant role in the design of modern integrated circuits (IC) operating increasingly at frequencies in the range of hundreds of megahertz. Increasing IC operating frequencies, coupled with reduced, submicron size structures, have made accurate simulation critical for components created within an IC.

As described in the parent application, U.S. Ser. No. 08/904,488, incorporated herein by reference in its entirety, historically, capacitive elements were computed from the geometry of an IC by using general purpose field solvers based on finite-difference or finite-element tools. Typical of these tools of the prior art is a requirement for volume or surface discretization. For finite-element tools, solutions are computed for large numbers of points descriptive of the electric field of the volume of an element within a device. Using this approach, as frequencies go up, the number of points required for a simulation also goes up resulting in large computation time and memory use for the completion of one simulation.

Another approach of the prior art is the use of integral equation methods. An example of this approach is FastCap: A multipole accelerated 3-D capacitance extraction program *IEEE Transaction on Computer Aided Design* 10(10):1447–1459, November 1991, incorporated herein by reference in its entirety.

Integral formulations have certain advantages over finite-difference or finite-element tools. These include good conditioning, reduction in dimensionality and ease in dealing with layered dielectrics. Discretizing an element using integral equations generally leads to a linear system of equations represented conveniently using a "dense" matrix. The inverse of this matrix is required to solve for the parameter being sought. Previous solution methods for this "dense" matrix have discretized the integral equation using a first-order collocation. In these methods, the charge density is assumed to be piecewise constant. With this crude approximation, computing accurate answers mandates large discretizations even for simple problems. That is, the matrix to be solved involves a large number of points thus impacting negatively the time required to arrive at a solution.

SUMMARY OF THE INVENTION

Above listed problems to the solution methods for the simulation of elements within an IC are avoided in accordance with one aspect of the invention by using a discretization technique, which reduces the integral equation to a finite system and by replacing the integral equation with a high-order quadrature. The element to be simulated is divided into regions, and each region is further divided into a plurality of quadrature nodes. Pairs are formed for all the quadrature nodes. Green's functions are computed and stored for the pairs thus obtained. Each of the pairs is allocated to either the far field or the near field for purposes of simulation in accordance with a criterion. The criterion includes the order of the high order quadrature, an accuracy, and the Green's function for each of the pairs. A Gaussian quadrature is computed for the pairs allocated to the far field while a high order quadrature is computed for the pairs of nodes allocated in the near field. The component simulation is arrived after combining information derived from the Gaussian quadrature and the high order quadrature. The information derived from the Gaussian and high order quadratures is generally combined in a matrix. Said matrix is solved to obtain the charge distribution. Summing over the charges yields the capacitance of the element being simulated.

The high order quadrature is computed using a plurality of basis functions. The basis functions, denoted $\psi_i^k(r')$, are 1, $x, y, x^2, xy, y^2$. The basis functions are used to compute a set of weights $v_j^k$. The weights are computed by solving $$\sum_{j=1}^{p} a_{ij} v_j^k = \int_{T_k} G(r, r') \psi_i^k(r') dr',$$

where $\psi_i^k(r')$ are the basis functions, $G(r,r')$ are the Green's functions for each of the pairs allocated to the near field separated by a distance r–r', and $a_{ij}$ is a matrix satisfying the relationship $$a_{ij} = G(r_i, r_j^k) \psi_i(r_j^k)$$

and where index k counts the regions in the near field $T_k$, index i counts the number of pairs, and index j counts up to a number p of the quadrature nodes in the near field.

The advantage of this approach is that a fast solution to an integral equation descriptive of the element to be simulated can be achieved in exchange for constructing quadratures.

BRIEF DESCRIPTION OF THE DRAWING

These and other features of the invention will become apparent from the following description and claims, when taken with the accompanying drawings, and in which:

DETAILED DESCRIPTION

A qualitative overview of the method and apparatus of a design tool of the invention will be presented before describing more rigorous mathematical illustrative embodiments of each part.

Figure 1:
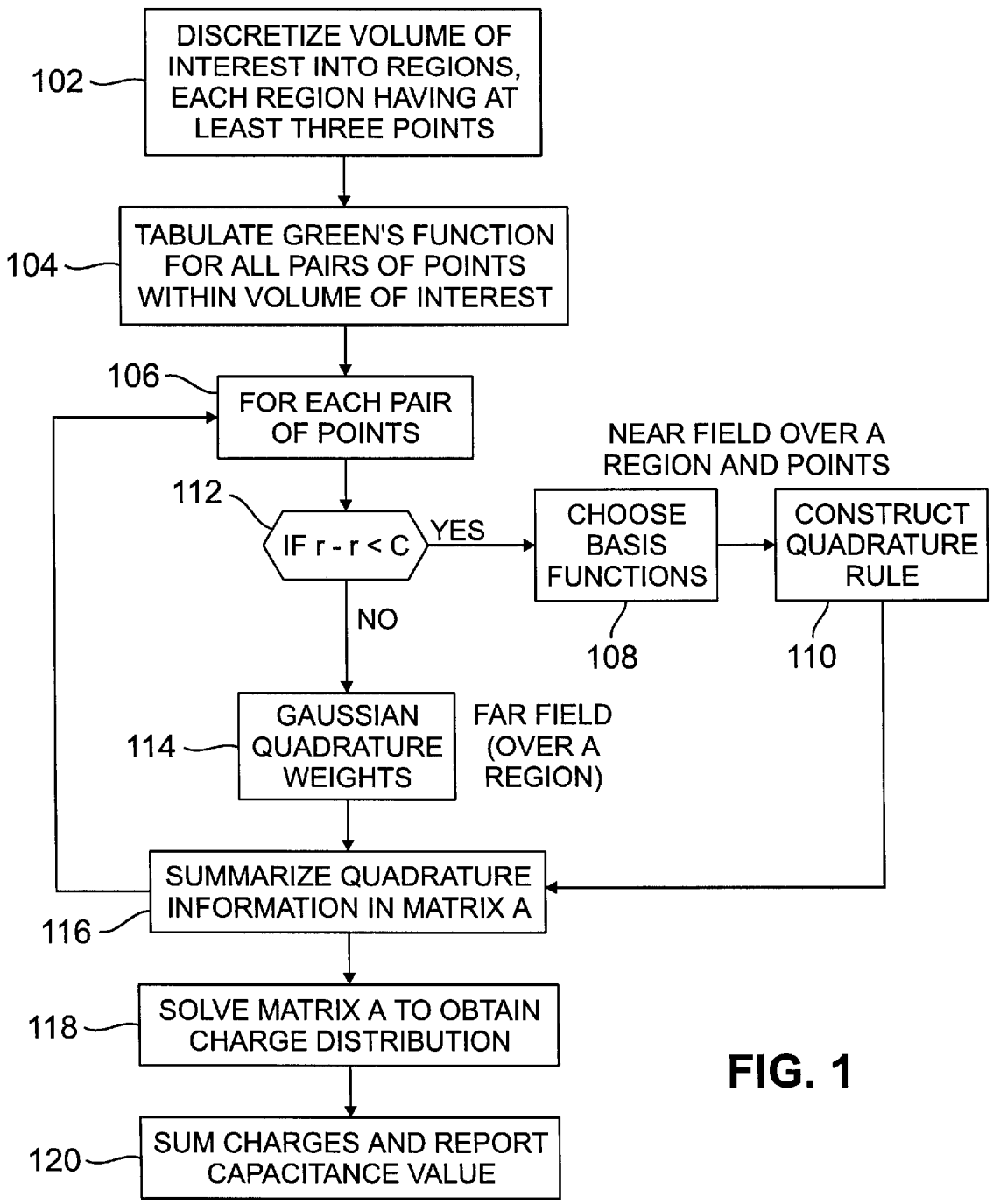
FIG. 1 is a flow diagram of the present invention.
Figure 2:
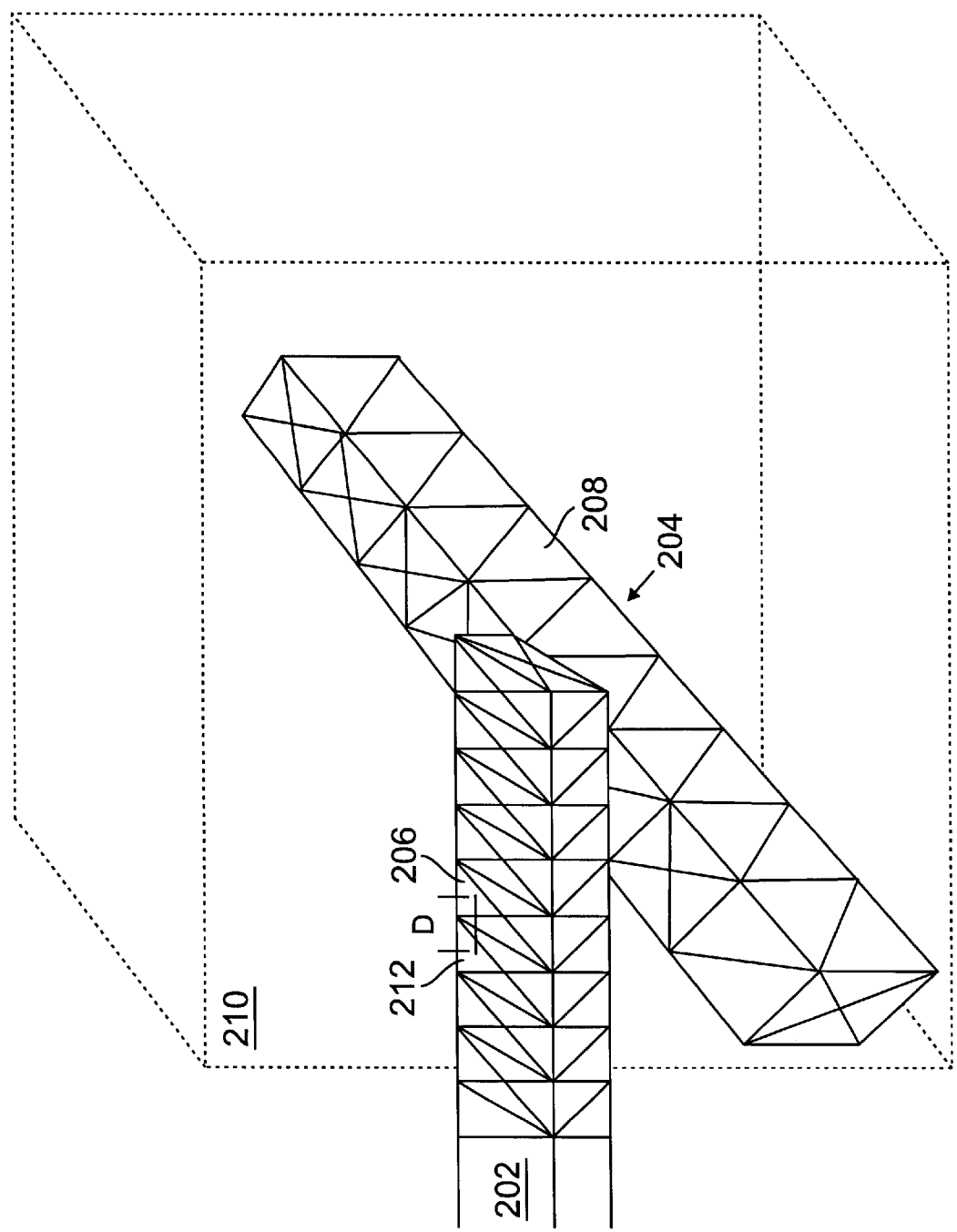
FIG. 2 is a structural outline of a structure of interest for which an exemplary capacitance extraction procedure in accordance with this invention is described.

Shown in FIG. 1 is the flow chart for the simulation tool for capacitance in accordance with the present invention. The first step, 102, requires the discretization of structures within the volume of interest into regions. In an example of this, as show in FIG. 2, conductors within a volume of interest are divided into a mesh of polygonal regions. In FIG. 2, conductors 202 and 204, part of volume of interest 210, intersect at an angle, thus forming a capacitor within volume 210. Exemplary polygonal regions such as 212 and 206 on the surface of conductor 202, and region 208 on conductor 204 discretize the surfaces of conductor 202 and 204. Polygonal regions 212 and 206 need not be equal in area, nor triangular, being generally chosen to cover a small surface assumed to be at an equipotential, i.e. equal voltage across the surface. Conversely, the distribution of electrical charge across a typical polygonal region is not known.

As part of the invention, the actual choice of the shape and area of a polygonal region, such as 206 or 212 can be done iteratively. That is, after a first solution for the charge distribution is solved using some initial (possibly equal) polygons, the area of the polygons can be changed to accommodate higher or lower charge distributions at certain locations within a typical capacitor to be modeled. Examples of where smaller polygons may be used to increase accuracy are corners, sharp edges, regions of high electric field intensity and the like.

For a structure in FIG. 2 such as conductors 202 and 204 within volume 210, described by a plurality of polygonal regions, such as regions 206, 208 and 212, the objective is to find the surface charge density distribution within each region, over the surfaces of the conductors within the volume of interest 210. Once the charges at each polygonal region describing conductor 202 and 204 are known, they are summed to compute the overall capacitance of the capacitor formed by conductors 202 and 204.

Figure 3:
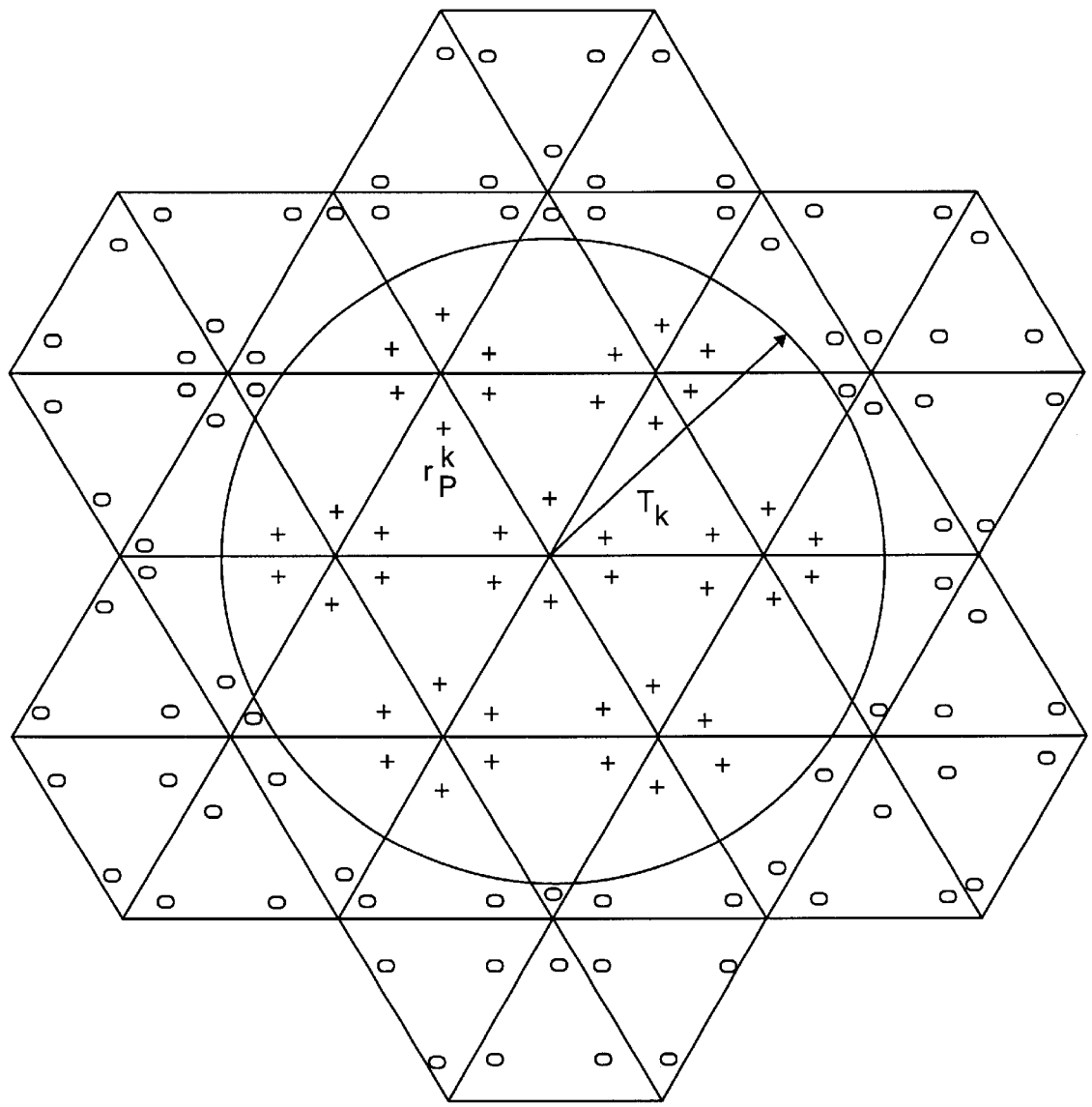
FIG. 3 is an exemplary map of quadrature points within regions, distinguishing between near field and far field locations.

As shown in block 104, within volume of interest 210, conductors 202 and 204 are discretized into multiple regions, k in number. Each region, in turn is allocated a plurality of quadrature nodes, for example 3. These exemplary 3 quadrature nodes i contained within each region k help compute and characterize the charge distribution within a particular region. Illustrative quadrature nodes $r_p^k$ within each region k are illustrated in FIG. 3.

Green's functions are tabulated for all pairs of regions k and quadrature nodes p. A typical example of a pair of regions is shown in FIG. 2 where regions 212 and 206 form one pair, separated by a distance D. Other examples of pairs of regions in FIG. 2 are 212 to 208, and 206 to 208. It is clear to one skilled in the art that such pairs can be formed for all combinations of regions and quadrature nodes as required on conductor 202 and 204 within volume 210. Each such pair, made of either regions or quadrature nodes, will be separated by a distance D, alternatively called r–r'.

For each pair of quadrature nodes, the distance r–r' is examined as shown in block 106. The solution involving these quadrature nodes is based on a decision made in accordance with block 112 with respect to each pair. If the distance is below a certain threshold C, meaning that the computation is conducted in the near field, certain basis functions are chosen as shown in block 108 and quadrature rules are applied as shown in block 110. Alternately, if the distance r–r' is above the threshold C, Gaussian quadrature weights are applied, implying that the effects within the pair of regions, or points is in the far field. Generally, the transition point between the near and far field is dependent on the order of the quadrature, the accuracy required and the Green's function. FIG. 3 shows quadrature points located in the far field, marked with a "o" and quadrature points located in the near field, identified with a "+". The points in the near field are within an exemplary distance $T_k$ in FIG. 3.

As further detailed in FIG. 1, once the quadratures rules for the near and far field are applied, the quadrature information is collected in a matrix A, descriptive of a linear system of equations as shown in block 16. The matrix A is solved in block 118 to obtain the charge distribution. In block 120, the charges over the element of interest are summed thus generating the capacitance value. Thus, the contribution to capacitance from each region, and points in each region (after solution) are computed.

In effect, using a discretization technique of quadrature, reduces the integral equation to a finite system of equations. In this invention, the integral equation is replaced with a high-order quadrature. The advantage, as compared to using a low order quadrature, is that a much smaller system of equations is needed in order to obtain a given accuracy.

Mathematical Analysis

A. The integral equation of the prior art.

The capacitance extraction problem can be generally summarized by the solution to a first-kind integral equation $$\phi(r) = \int_R G(r,r')\sigma(r')dr' \quad (1)$$

where $\phi$ is the potential, $\sigma$ is the surface charge density, R ranges over the surfaces of conductors, such as 202 and 204, within volume of interest 210, and G is the Green's function. In free-space, the Green's function is $1/(4\pi\epsilon_0|r-r'|)$, while for layered media, the Green's function can be precomputed and tabulated. To solve the integral equation numerically, generally an area R is discretized and the resulting equations are expressed as a matrix equation. The typical approach of the prior art is to use first-order collocation or Galerkin methods as described by X. Cai, K. Nabors, and J. White in *Efficient Gallerkin Techniques for Multipole Accelerated Capacitance Extraction of 3D structures with Multiple Dielectrics,* Proceedings of the 16th Conference on Advanced Research in VLSI, Chapel Hill, N.C., March 1995, incorporated herein by reference in its entirety.

B. Errors of First-Order Approximations.

In a Galerkin approach, the integral equation (1) for $\phi(r)$ above is reduced to a matrix problem by projection onto the space spanned by an orthonormal set of basis functions $f_1, f_2, \ldots, f_n$. The approximate solution:

$$\tilde{\sigma}(r) = \sum_{i=1}^{n} c_i f_i(r) \quad (2)$$

is obtained by solving the system of equations given by:

$$\sum_{j=1}^{n} a_{ij} c_j = \phi_i, \, i = 1, \ldots, n \quad (3)$$

where $$\psi_i = \int_R \phi(r) f_i(r) dr \quad (4)$$

and $$a_{ij} = \int_R \int_R G(r,r') f_i(r) f_j(r') dr \, dr' \quad (5)$$

The quality of the approximation $\tilde{\sigma} \approx \sigma$ is measured by the size of the differences $$\left| G(r, r') - \sum_{i=1}^{n} \sum_{j=1}^{n} a_{ij} f_i(r) f_j(r') \right|. \tag{6}$$

In general, a typical volume of interest, such as 210, or an area R is subdivided into regions $\{T_1, T_2, \ldots, T_n\}$, and the functions $f_i$ are taken to be piecewise constant (a first-order method). Since a true Galerkin scheme requires accurate evaluation of the double integrals of the singular kernels of equation, first-order collocation schemes are more popular. In such a scheme exemplified by the Fastcap program referenced supra, σ is still assumed to be piecewise constant over each region, but the equation is enforced at just a single point $r_i$ in each region. Then, the integral equation reduces to the following set of equations:

$$\phi(r_i) = \sum_{j=1}^{n} \left( \int_{T_j} G(r_i, r') dr' \right) \sigma(r_j). \tag{7}$$

In both first-order collocation and Galerkin methods, the asymptotic error is at least 1/N (in a Galerkin method the constant associated with the error is smaller). The situation is even worse when the boundary has edges or corners with strong solution singularities. Hence, accurate solutions require extremely fine discretizations, and therefore high computational cost.

Applying High-order Methods

In response to above limitations, the inventors observed that a more efficient alternative is to use a high-order method, such as, for example, the Nyström method for solving equation (1).

A sample high order method, such as the Nyström method, in general, represents the functions σ and φ in the integral equation 8:

$$\phi(r) = \int_R G(r, r') \sigma(r') dr' \tag{8}$$

by their values at selected points $\{r_1, r_2, \ldots, r_n\}$ on R and replaces the integral by a quadrature. A quadrature is a formula of the form $$Q(f) = \sum_{i=1}^{n} w_i f(r_i) \tag{9}$$

with the property that $$\int_R f(r) dr = Q(f) + E(f). \tag{10}$$

The term E(f) is called the quadrature or truncation error. The points $r_i$ are called quadrature nodes and the $w_i$ are called weights.

One object of the invention is to approximate the definite integral of a function f by evaluating it at a finite number of sample points or quadrature nodes. Although described by many, as for example, Stoer and R. Bulrish in *Introduction to Numerical Analysis,* Springer Verlag, N.Y. 1979, the formulation for evaluating the integral function at a finite number of points is known for some, but not all functions. The discrete equivalent for the present set of equations is solved below.

By enforcing equation (8) at each $r_i$ and replacing the integral by a quadrature, this linear system of equations is obtained:

$$\sum_{j=1}^{n} w_{ij} G(r_i, r_j) \sigma(r_j) = \phi(r_i), i = 1, \ldots, n. \tag{11}$$

The $w_{ij}$ are quadrature weights that depend on the Green's function G. If matrix A is defined as:

$$A_{ij} = w_{ij} G(r_i, r_j),$$

then multiplying the vector of charge densities by the matrix A gives the vector of potentials.

Therefore, the error in this method is proportional to the quadrature error:

$$\left| \sum_{j=1}^{n} w_{ij} G(r_i, r_j) \sigma(r_j) - \int_R G(r_i, r') \sigma(r') dr' \right|, \tag{12}$$

where σ is the true solution. This formulation of the error is detailed by S. G. Michlin in *Integral Equations and their Applications to Certain Problems in Mechanics, Mathematical Physics,* and *Technology,* Pergammon Press, N.Y., 1957.

The novelty in applying a high order, Nystrom type method in this invention is the development of quadrature weights $w_{ij}$ that are accurate for a set of basis functions broad enough to closely approximate the solution to the charge distribution within each region. In the following section, we introduce quadrature methods of this invention that improve upon known methods for three-dimensional extraction problems.

Quadrature Construction

Structures for capacitance extraction problems are typically described in terms of a mesh of triangles (or, more generally, polygonal regions) $T_k$ in $R^3$ as shown in FIG. 3. R is the union, or area covered by all triangles located within a volume of interest such as 210. Quadrature nodes $r_p^k$ are within each triangle. in FIG. 3, three such exemplary quadrature nodes are shown within each triangle k. In the following exemplary discussion, it is assumed for notational simplicity that all the triangles $T_k$ in the mesh lie in the x-y plane. In general, local transformations to barycentric coordinates are made. For triangle $T_k$, we choose a set $\{\psi_1^k, \ldots, \psi_p^k\}$ of basis functions which have values $$\{1, x, y, x^2, xy, y^2, \ldots\} \tag{13}$$

in $T_k$ and which are zero elsewhere. Given a point r, a quadrature rule for computing this equation is constructed from:

$$\int_{T_k} G(r, r') \psi_i^k(r') dr' \tag{14}$$

for $i = 1, \ldots, p$.

An improvement offered by this invention avoids a problem arising from an integrable singularity within R. Note that the Green's function G(r,r') in above equation (14) has an integrable singularity at the point r=r'. Thus, without the methods of this invention, the singularity would render the results inaccurate. Good convergence and accuracy depend on the correct treatment of this singularity in accordance with this invention.

The integrals over $T_k$ fall into two classes, as shown in FIG. 3: the far field and the near field. If r is far from $T_k$, that is ($|r-r'| > c$), the far field, use standard Gaussian quadrature, as explained by A. H. Stroud in *Gaussian Quadrature*

*Formulas,* Prentice Hall, N.Y., 1966. To apply Gaussian quadrature, the points $r_1^k, \ldots, r_p^k$ inside of $T_k$ where $\phi$ and $\sigma$ are tabulated must be Gaussian nodes. Then, the far-field quadrature weights are standard Gaussian weights $w_1^k, \ldots, w_p^k$ as discussed in the A. H. Stroud reference above.

It was found by the inventors that in this case Gaussian quadrature only works well in regions where the Green's function $G(r,r')$ is smooth, i.e., the far field. When the singular point r is close to $T_k$ ($|r-r'| \leq c$), i.e., the near field, the singularity is strong thus needing solutions described by this invention.

In the near field, a special quadrature is constructed for evaluating the integral equation (14) above thus avoiding the singularity of the Green's function.

A) Set up a system of equations which must be satisfied by the unknown weights $v_1^k, v_2^k, \ldots, v_p^k$.

Let $$a_{ij} = G(r_i, r_j^k) \psi_i(r_j^k) \qquad (15)$$

for i,j=1, . . . , p.

B) The requirement that the weights correctly integrate each basis function is equivalent to the weights satisfying the system of equations (16):

$$\sum_{j=1}^{p} a_{ij} v_j^k = \int_{T_k} G(r, r') \psi_i^k(r') dr'. \qquad (16)$$

C) Solve for the weights $v_j^k$ by LU factoring the p×p matrix $a_{ij}$. The weights will exactly integrate any linear combination of the basis functions convolved with $G(r,r')$.

Note that the weights $v_j^k$ depend both on the particular triangle $T_k$ in FIG. 3 and on the singular point r. This is in contrast to the Gaussian weights, which depend on the triangle but not on a point within the triangle.

From a computational efficiency point of view, note that the near-field for any given triangle encompasses only a small number of other triangles. Hence, the number of weights which must be explicitly computed is small. In free space problems, analytic formulas are used to evaluate the singular and near-singular integrals needed on the right-hand side of equation (16).

As another example, for layered media Green's functions, the singularity is removed analytically and adaptive Gaussian quadrature are used to evaluate the remaining smooth part.

The integral over all of R to the point r is given by the sums over individual triangles:

$$\sum_{nearT_k} \sum_{i=1}^{p} v_i^k G(r, r_i^k) + \sum_{farT_k} \sum_{i=1}^{p} w_i^k G(r, r_i^k). \qquad (17)$$

The combination of all such quadrature rules as r ranges over the nodes $r_i^k$ defines the matrix in equation 11.

The separation between the near field and the far field is defined by the distance at which the Gaussian weights cease to be adequate for evaluating equation (14). This distance depends on the order of the quadrature, the accuracy required and the Green's function. Distance is measured from the $T_k$'s centroid in FIG. 3 and is scaled so that the distance to the farthest vertex of the triangle is one unit. To obtain 0.1% accuracy using the free-space Green's function and a third-order rule, the Gaussian weights are sufficient for points at a distance of 2 or more. For typical discretizations, almost all the points are farther away than this. Hence the number of specialized quadratures is very small.

Note the choice of basis functions $\{1, x, y, x^2, xy, y^2, \ldots\}$ that is used as part of this invention. As a test of the adequacy of these basis functions for the task at hand, the solution is smooth hence this choice is efficient. For other examples, e.g., singular solutions, as found in problem domains with edges and corners, this choice is not optimal. Instead, it is envisioned to use more sophisticated basis functions which incorporate the behavior of the solution singularity.

Rapid Matrix Solution

Solution of the linear system $A\sigma = \phi$ via direct factorization is generally prohibitive in terms of computation time. However, because of the basis functions and weights of this invention, the resulting matrix is well-conditioned. One way to solve for the inverse of this matrix is to use a Krylov-subspace iterative schemes such as outlined by Y. Saad and H. M. Schultz in GMRES A generalized minimal residual algorithm for solving non symmetric linear systems, SIAM Journal on Scientific and Statistical Computing, 7(3):856–869, July 1986. Iterative solvers require application of the matrix A to a sequence of recursively generated vectors. The dominant com- puting costs become the $O(n^2)$ time and space required for constructing and storing the matrix and the $O(n^2)$ time required for each matrix-vector product. While this is already an improvement over direct factorization, the storage and computational cost is still excessive. Each of these costs can be reduced to $O(n \log n)$ for typical problems using the fast integral equation solver IES[3] as described in the parent application.

As described in the parent application, the idea behind IES[3] is to exploit the fact that Green's functions vary smoothly with distance. Consequently, large parts of the matrix A are numerically low-rank. These low-rank regions are represented as sparse outer products using the singular value decomposition (SVD). The SVD is an effective tool for the compression of rank deficient matrices. Based on this observation, the parent application describes a scheme for recursively partitioning, sampling and compressing matrixes generally encountered in the application of this invention.

In one exemplary implementation of this invention, an apparatus for extracting a parameter of a component comprises the following. A discretizing means for discretizing said component into a plurality of regions. That is, the geometry of the component is first described using known techniques in a general purpose computer. Then the component is divided, or discretized, into regions of a size previously chosen. Each region in turn is divided by a quadrature node generating means (another process within the general purpose computer) for dividing said regions into a plurality of quadrature nodes. Pairing means for forming a plurality of pairs from said quadrature nodes are also implemented as a process within a general purpose computer. Further processor means within the general purpose computer computes a Green's function for each of said pairs formed from said quadrature nodes. Thus computed Greens functions are stored within memory means of said general purpose computer for said pairs. An allocating means for allocating each of said pairs to a far field and a near field based on a criterion is also implemented within said general purpose computer.

A first computing means for computing a Gaussian quadrature for said pairs allocated to said far field is again typically implemented within the general purpose computer. A second computing means for computing a high order quadrature for said pairs nodes allocated to said near field also runs as a process within the general purpose computer. Furthermore, a combining means for combining information derived from said Gaussian quadrature and said high order quadrature generates a matrix. This matrix is solved, typically using IES[3] to obtain the charge distribution. The summation of the charge distribution describes the capacitance of said component.

All references cited in this document are incorporated herein by reference in their entirety.

Although presented in exemplary fashion employing specific embodiments, the disclosed structures are not intended to be so limited. Those skilled in the art will also appreciate that numerous changes and modifications could be made to the embodiment described herein without departing in any way from the invention. For example, another set of basis functions is envisioned, wherein the basis functions can be specially chosen to accommodate certain charge distributions. Consequently, weights working in conjunction with the basis functions will be different. These changes and modifications and all obvious variations of the disclosed embodiment are intended to be embraced by the claims to the limits set by law.

What is claimed is:

1. An apparatus for extracting a parameter of a component, said apparatus comprising:

discretizing means for discretizing said component into a plurality of regions;

quadrature node generating means for dividing said regions into a plurality of quadrature nodes;

pairing means for forming a plurality of pairs from said quadrature nodes;

processor means for computing a Green's function for each of said pairs formed from said quadrature nodes;

memory means for storing said Green's functions generated by said processor means for said pairs;

allocating means for allocating each of said pairs to a far field and a near field based on a criterion;

first computing means for computing a Gaussian quadrature for said pairs allocated to said far field;

second computing means for computing a high order quadrature for said pairs nodes allocated to said near field;

combining means for combining information derived from said Gaussian quadrature and said high order quadrature to simulate said component, wherein said criterion for allocating each of said pairs includes the order of said high order quadrature, an accuracy, and said Green's function for each of said pairs and wherein said means for computing said high order quadrature includes a plurality of basis functions, said basis functions, denoted $\psi_i^k(r')$, comprising $1, x, y, x^2, xy, y^2$.

2. An apparatus as described in claim 1 wherein said basis functions are used to compute a set of weights $v_j^k$, said weights computed by solving $$\sum_{j=1}^{p} a_{ij} v_j^k = \int_{T_k} G(r, r') \psi_i^k(r') dr',$$

for said weights, where $\psi_i^k(r')$ are said basis functions, $G(r,r')$ are said Green's functions for each of said pairs allocated to the near field separated by a distance r–r', and $a_{ij}$ is a matrix satisfying the relationship $$a_{ij} = G(r, r_j^k) \psi_i(r_j^k)$$

and where index k counts said regions in said near field $T_k$, index i counts the number of said pairs, and index j counts up to a number p of said quadrature nodes in said near field.

3. A method for extracting a parameter of a component, said method comprising the steps of:

discretizing said component into a plurality of regions;

dividing said regions into a plurality of quadrature nodes;

forming a plurality of pairs from said quadrature nodes;

computing a Green's function for each of said pairs formed from said quadrature nodes;

storing said Green's functions;

allocating each of said pairs to a far field and a near field based on a criterion;

computing a Gaussian quadrature for said pairs allocated to said far field;

computing a high order quadrature for said pairs nodes allocated to said near field; and combining information derived from said Gaussian quadrature and said high order quadrature to simulate said component, wherein said step of allocating each of said pairs evaluates the order of said high order quadrature, an accuracy and said Green's function for each of said pairs and wherein said computing of said high order quadrature includes a plurality of basis functions, said basis functions, denoted $\psi_i^k(r')$, comprising $1, x, y, x^2, xy, y^2$.

4. A method as described in claim 3 wherein said basis functions are used to compute a set of weights $v_j^k$, said weights computed by solving $$\sum_{j=1}^{p} a_{ij} v_j^k = \int_{T_k} G(r, r') \psi_i^k(r') dr',$$

for said weights, where $\psi_i^k(r')$ are said basis functions, $G(r,r')$ are said Green's functions for each of said pairs allocated to the near field separated by a distance r–r', and $a_{ij}$ is a matrix satisfying the relationship $$a_{ij} = G(r, r_j^k) \psi_i(r_j^k)$$

and where index k counts said regions in said near field $T_k$, index i counts the number of said pairs, and index j counts up to a number p of said quadrature nodes in said near field.

* * * * *